United States Patent [19]

Nagashima et al.

[11] Patent Number: 4,901,079
[45] Date of Patent: Feb. 13, 1990

[54] ANALOG-DIGITAL CONVERTER

[75] Inventors: Nao Nagashima, Tokyo; Koji Suzuki, Yokohama; Jyoji Nagahira, Tokyo; Kouki Kuroda, Yokohama; Yoshiaki Takayanagi, Kawasaki, all of Japan

[73] Assignee: Canon Kabushiki Kaisha, Tokyo, Japan

[21] Appl. No.: 153,568

[22] Filed: Feb. 2, 1988

Related U.S. Application Data

[63] Continuation of Ser. No. 873,481, Jun. 12, 1986, abandoned, which is a continuation of Ser. No. 723,005, Apr. 16, 1985, abandoned, which is a continuation of Ser. No. 436,803, Oct. 26, 1982, abandoned, which is a continuation of Ser. No. 215,827, Dec. 12, 1980, abandoned.

[30] Foreign Application Priority Data

Dec. 21, 1979 [JP] Japan ............................... 54-166774

[51] Int. Cl.$^4$ ............................................. H03M 1/56
[52] U.S. Cl. ..................................... 341/169; 341/166
[58] Field of Search ................ 340/347 AD, 347 NT, 340/347 M, 347 CC; 324/99 D; 341/155, 157, 158, 164, 165, 166, 169

[56] References Cited

U.S. PATENT DOCUMENTS 3,531,208  9/1970  Ward ........................... 340/347 M X
4,127,810  11/1978  Purland ........................... 324/99 D
4,381,498  4/1983  Goodale ............................ 341/169

OTHER PUBLICATIONS

Hatch, Micoprocessor Multiplies a Digital Multimeter's Functions, Electronics, Sep. 16, 1976, pp. 97–101.

Gellender, Learn Microprocessor Fundamentals, Electronic Design, 21, Oct. 11, 1977, pp. 74–79.
Hnatek, A User's Handbook of D/A and A/D Converters, J. Wiley & Sons, 1976, pp. 14, 15 & 246–251.
Rockwell, PPS-4/1 Single Circuit Microcomputer Product Description, 12/1975, pp. 1–22.
Walton, Analog-To-Digital Converter, IBM Technical Disclosure Bulletin, vol. 7, No. 10, 3/1965, pp. 881–885.

*Primary Examiner*—William M. Shoop, Jr.
*Assistant Examiner*—Brian Young
*Attorney, Agent, or Firm*—Fitzpatrick, Cella, Harper & Scinto

[57] ABSTRACT

An analog-to-digital converter comprises an output generator for forming an output signal in response to application of a start signal; a comparator for comparing an analog signal, to be converted to a digital signal, with the level of the output signal formed by the output generator and for providing an output representing the time period from initiation of formation of the output signal to occurrence of a predetermined relation between the output signal and the analog signal; and a clock signal generator. The converter further comprises a digital computer that includes an output terminal from which the start signal is applied to the output generator and an input terminal for receiving the output from the comparator. The computer further includes a counter for counting the pulses produced by the clock signal generator from the time the start signal is applied from the output terminal until a time when the input terminal receives the output representing the aforesaid time period, and a digital signal generator for forming a digital signal corresponding to the output signal on the basis of the count of clock pulses by the counter.

3 Claims, 6 Drawing Sheets

ANALOG-DIGITAL CONVERTER

This application is a continuation of application Ser. No. 873,481 filed 6/12/86, now abandoned; which was a continuation of application Ser. No. 723,005 filed Apr. 16, 1985, now abandoned; which was a continuation of application Ser. No. 436,803 filed Oct. 26, 1982, now abandoned; which was a continuation of application Ser. No. 215,827 filed Dec. 12, 1980, now abandoned.

BACKGROUND OF THE INVENTION

1. Field of the Invention

The present invention relates to an analog-digital (A/D) converter for converting an analog signal into a digital signal.

BRIEF DESCRIPTION OF THE PRIOR ART

The conventional A/D converter, when connected to a digital computer, requires plural control signals or plural data signals according to the precision of the A/D converter, thus necessitating an increase in the number of input/output ports with an additional cost in the case of a digital computer having a limited number of ports, or requiring a complicated control for the converter.

SUMMARY OF THE INVENTION

The object of the present invention is to provide an A/D converter eliminating the above-mentioned drawbacks, and more particularly an A/D converter utilizing digital computer as a part thereof.

DESCRIPTION OF THE PREFERRED EMBODIMENTS

The present invention will be clarified in detail by the following description of an embodiment in which a microcomputer is utilized as the digital computer.

Figure 1:
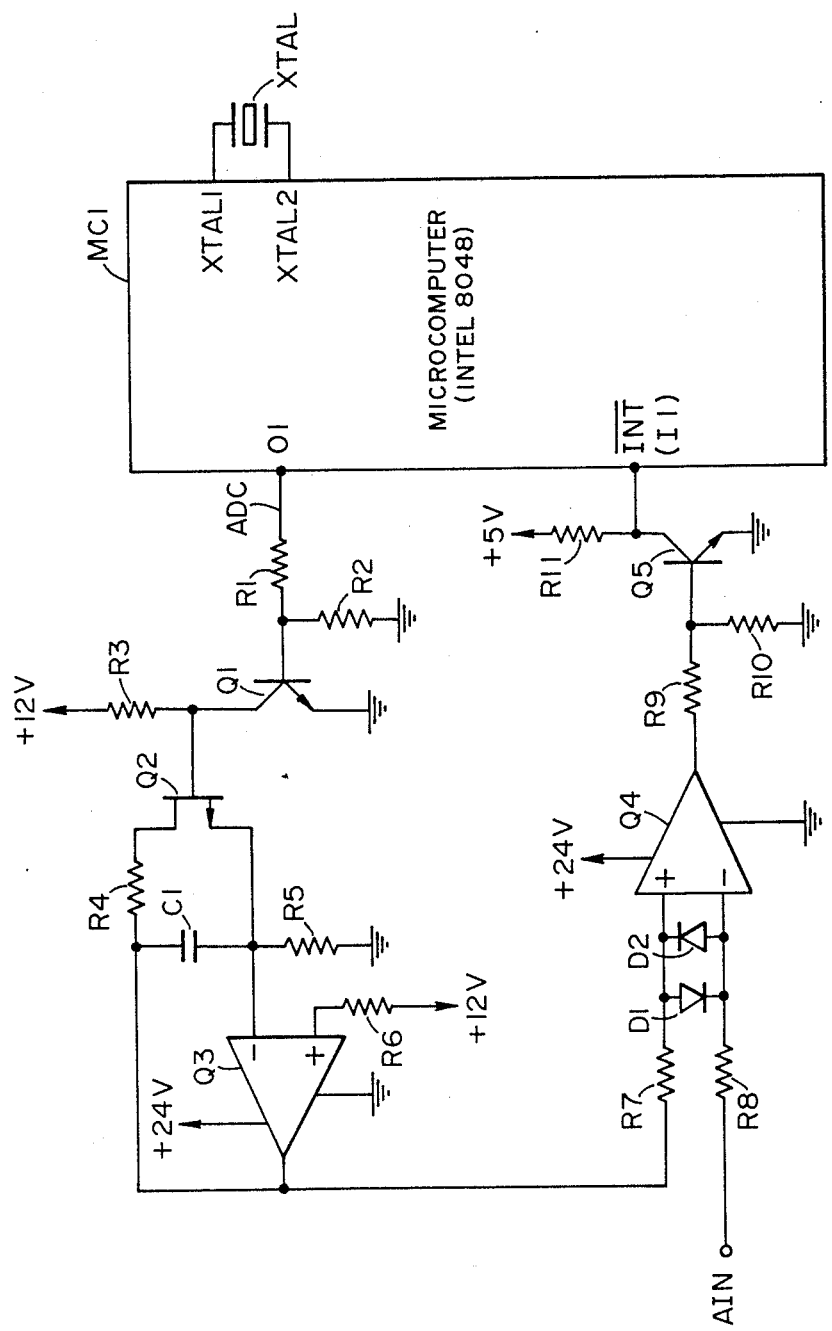
FIG. 1 is a control circuit diagram of one embodiment of the A/D converter embodying the present invention.
Figure 4:
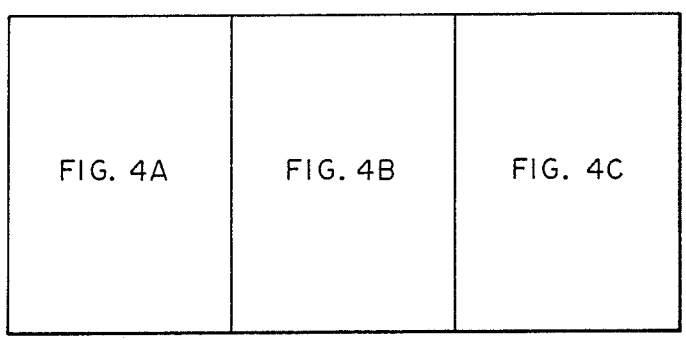
FIG. 4 shows an arrangement of FIGS. 4A, 4B and 4C.

FIG. 1 shows an example of the circuit of the A/D converter of the present invention, wherein MC1 represents a one-chip microcomputer for example composed of Intel 8048 the internal block diagram of which is shown in FIG. 4. A transistor Q1 and an FET Q2 short circuit or open the terminals of a capacitor C1 in response to an A/D conversion start signal ADC supplied from the microcomputer MC1. In case the FET Q2 is composed of a depletion type one, the terminals of the capacitor C1 are opened or short circuited, respectively, at the high level and low level of the signal ADC.

An integrating circuit is composed of an operational amplifier Q3, the capacitor C1 and a resistor R5, whereby the output of the operational amplifier Q3 linearly increases from an initial value of 12V with a slope determined by the time constant $C1 \times R5$ when the terminals of the capacitor C1 are opened by the high-level state of the A/D conversion start signal ADC. The output of the amplifier Q3 is supplied to the non-inverted input terminal of a comparator Q4, the inverted input terminal of which receives from a terminal AIN an analog signal to be measured.

When the output of the amplifier Q3 becomes larger than the analog input signal, the output of the comparator Q4 is inverted to turn a transistor Q5 on, thus shifting the terminal potential of an interruption terminal INT of the microcomputer MC1 to low level, thereby enabling interruption. In the present embodiment the interruption procedure is utilized for saving by a timer count. In FIG. 1 there is also shown a crystal oscillator XTAL for supplying clock signals to the microcomputer MC1.

Figure 2:
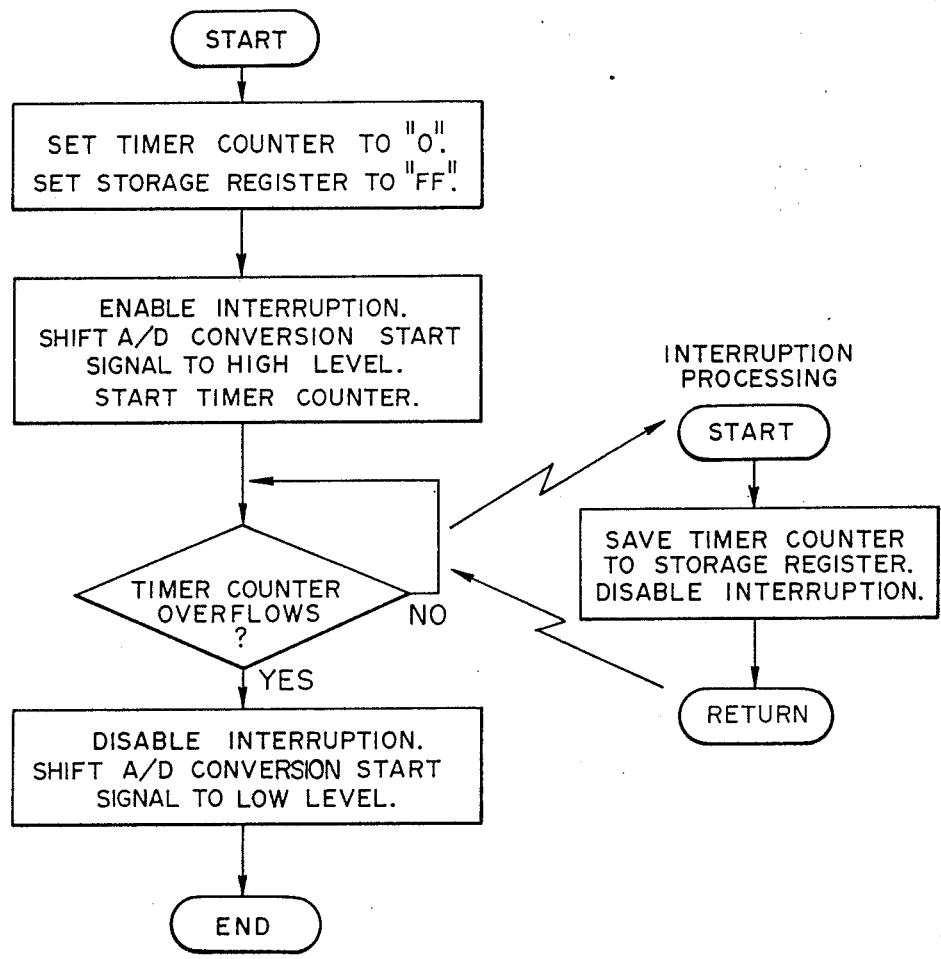
FIG. 2 is an example of the flow chart for A/D conversion.
Figure 4A:
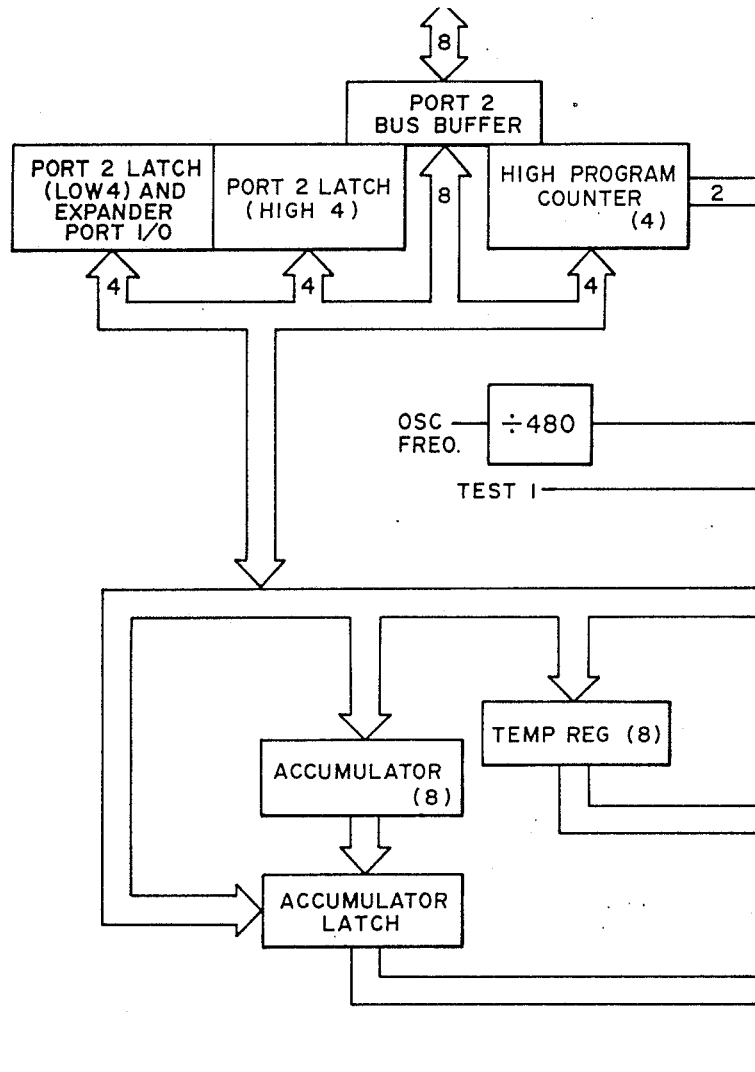
FIGS. 4A, 4B and 4C show as a whole a control block diagram in a microcomputer MC1.
Figure 4A:
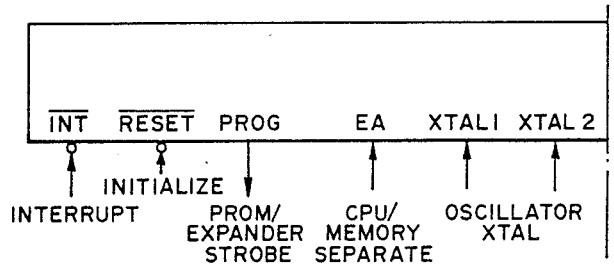
Figure 4B:
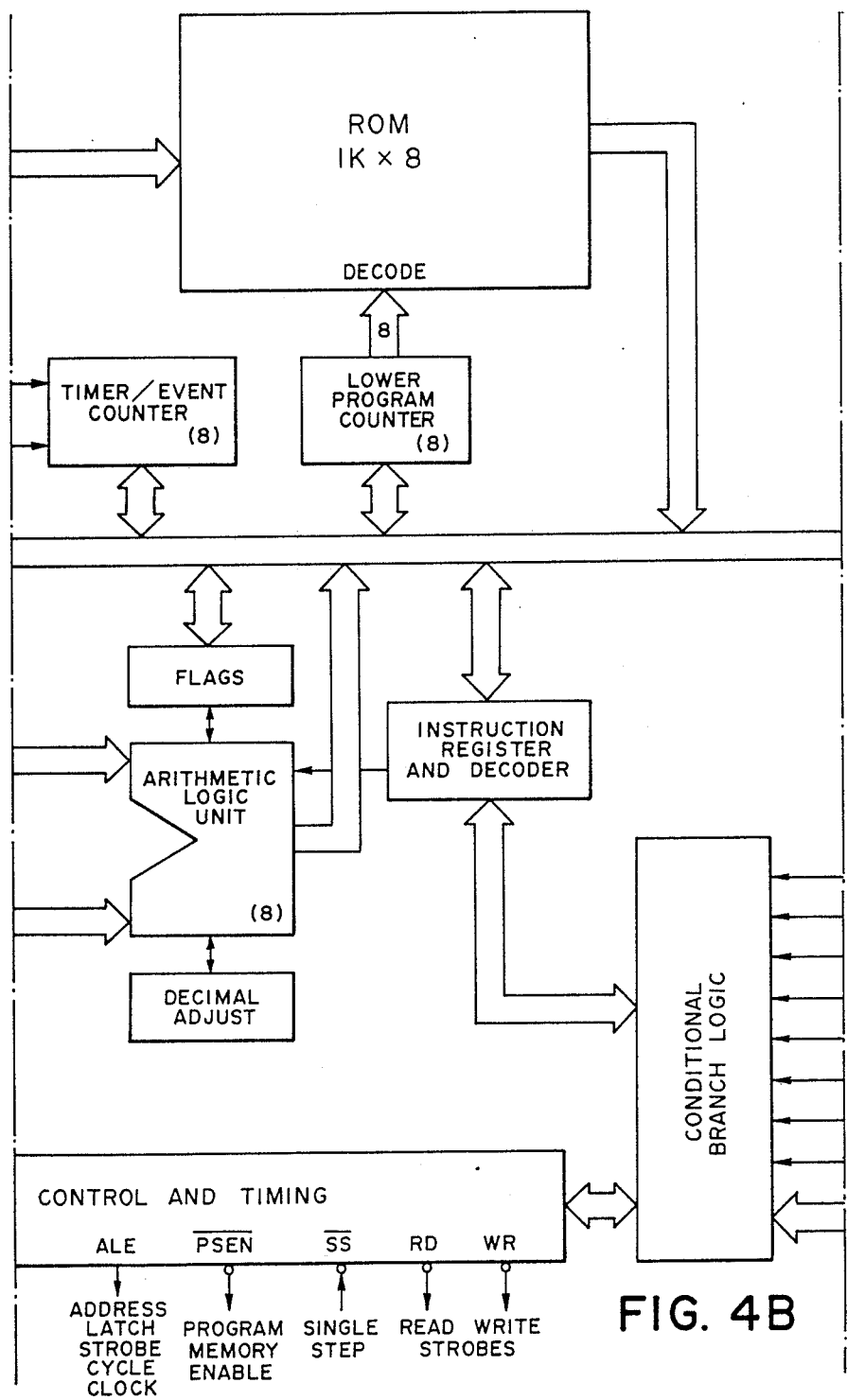
Figure 4C:
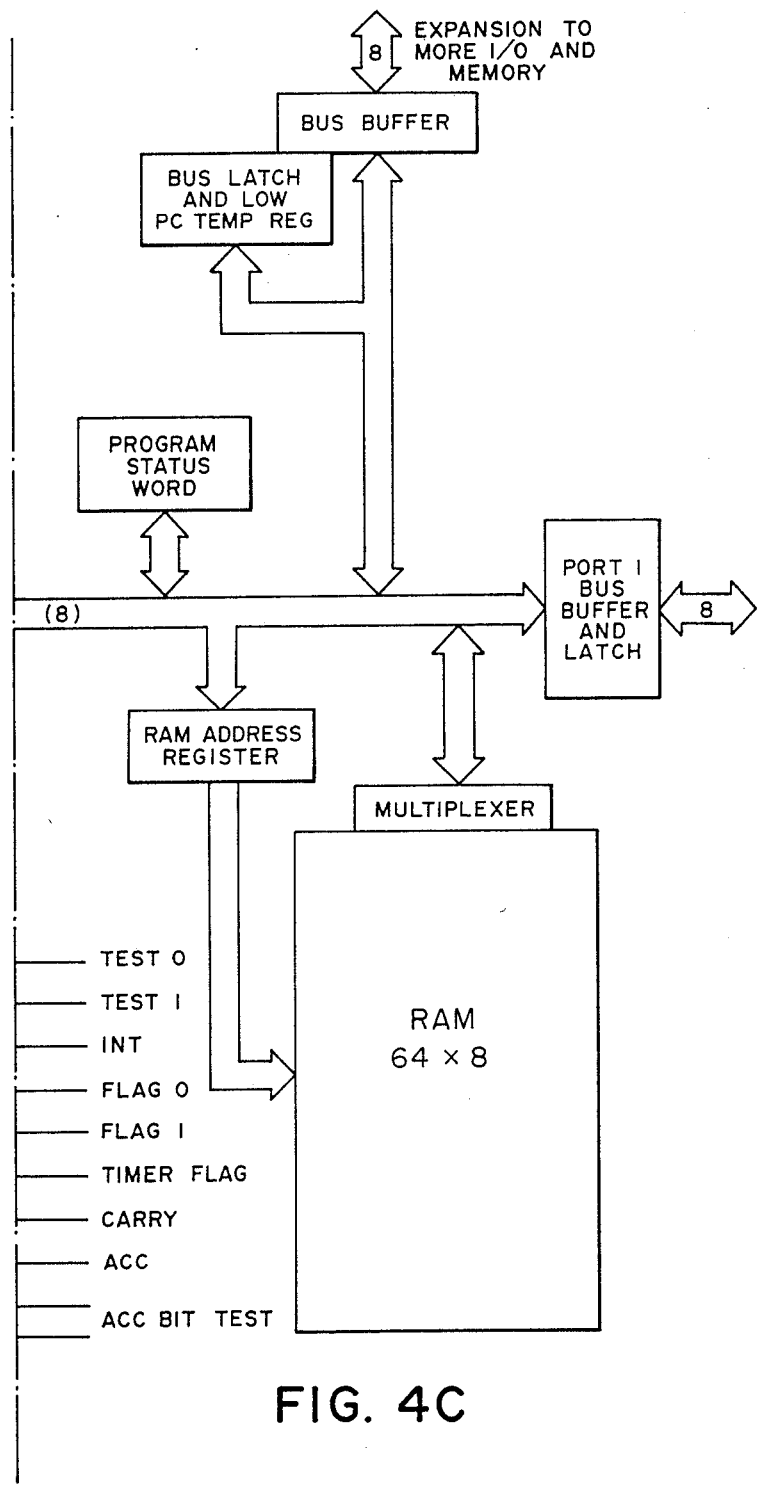

FIG. 2 shows a flow chart of the program for A/D conversion stored in a read-only memory ROM of the microcomputer MC1 as shown in FIGS. 4A, B and C. In the example shown in FIG. 2, an 8-bit digital signal is obtained by the A/D conversion, and there is used an 8-bit internal timer counter provided in said microcomputer MC1, the content of said internal timer counter being incremented for about every 10 micro-seconds. In fact, the timer counter counts the clock signals obtained by counting down the frequency of the output signals of the crystal oscillator XTAL to 1/480.

In the flow chart shown in FIG. 2, the content of the timer counter is at first set to "0", and a storage register for converted value is set to "FF". Then the interruption is enabled to shift the A/D conversion start signal to the high level, and the timer counter is activated simultaneously, whereby the integrating circuit composed of the operational amplifier Q3 in FIG. 1 initiates the function thereof. When the output of said amplifier Q3 becomes larger than the analog input signal, the interruption process is initiated to shift the content of the timer counter to said storage register provided in the random-access memory RAM of the microcomputer MC1 (FIGS. 4A, B, and C). When the timer counter overflows thereafter, the interruption is disabled to shift the A/D conversion start signal ADC to the low level thereby resetting the integrating circuit. After the above-mentioned process, the converted value is stored in said storage register.

In the present embodiment the maximum value "FF" is stored in said storage register in advance in order to avoid the "0" converted value in case the interruption process is not initiated before the overflowing of the timer counter, i.e. in case the analog signal is larger than expected.

In the embodiment shown in FIG. 1 a discrimination signal resulting from the analog signal and output signal of the integrating signal is entered through the interruption port INT, but it is also possible to enter the signal through an ordinary port.

Figure 3:
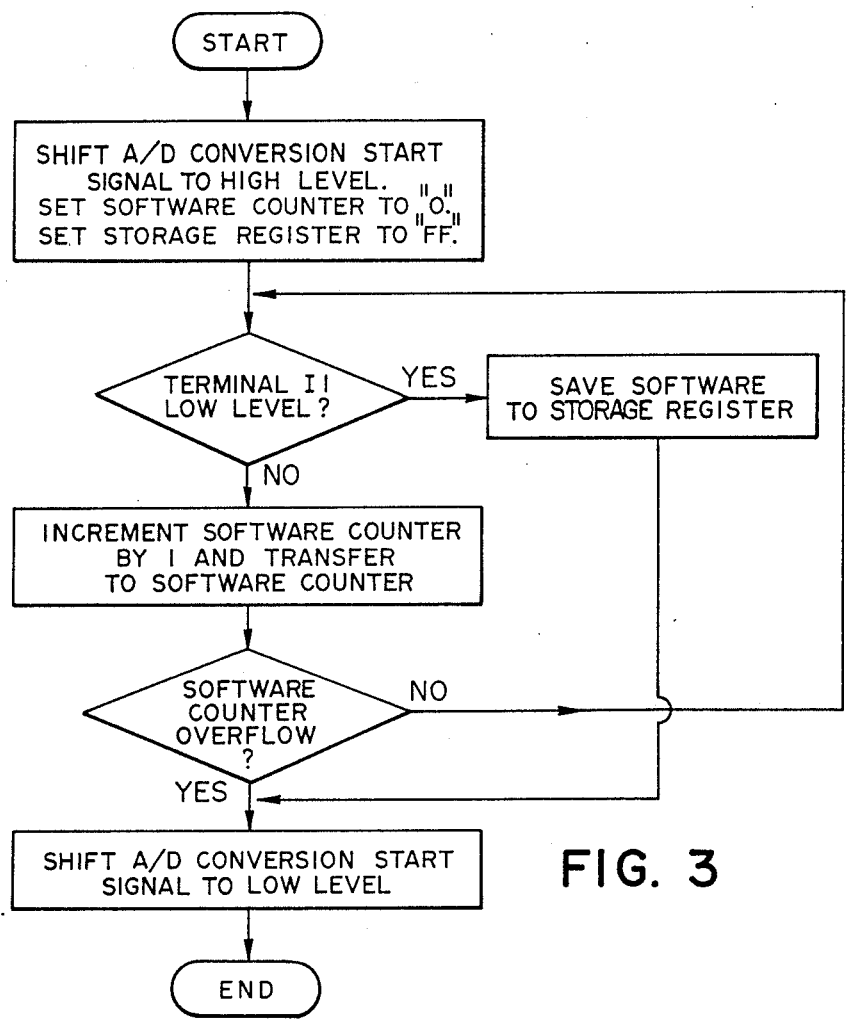
FIG. 3 is an example of the flow chart for A/D conversion without utilizing interrupt function.

FIG. 3 shows a flow chart of the program for A/D conversion to be stored in the microcomputer MC1 in which the discrimination signal is entered through an ordinary input port.

According to the flow chart in FIG. 3, the A/D conversion start signal ADC is at first shifted to the high level and the contents of a software counter and a storage register for converted value are respectively set to "0" and "FF" thereby initiating the A/D conversion. Then identified is whether an ordinary input port I1 is at the low level state, and, if not, the content of the software counter is incremented. On the other hand, in case the port I1 is at the low level state, the content of the software counter is transferred to the storage register provided in the random access memory of the microcomputer MC1 and the A/D conversion start signal ADC is shifted to the low level to terminate the A/D conversion.

In case the port I1 is at the high level state, there are repeated the steps of terminal I1 checking, increment of the content of said software counter and overflow checking of said software counter at determined time intervals. The A/D conversion is terminated either by the low level state of the A/D conversion start signal in response to the entry of a low level signal to the port INT or to the overflowing of the software counter.

Through the above-mentioned program the microcomputer MC1 receives a digital value corresponding to the period until the shifting of the port I1 to the low level, thereby achieving A/D conversion without utilizing the interruption procedure.

In place of the voltage change caused by the charging of an integrating circuit employed in the foregoing embodiment, it is also possible to utilize the voltage change caused by a discharge or to employ other means causing a monotonous increase or decrease in voltage.

As explained in the foregoing, the A/D converter of the present invention is featured by output means showing a monotonous increase or decrease in the output voltage thereof, signal generating means for generating an instruction signal for initiating the monotonous voltage increase or decrease of said output means, a comparator circuit for comparing an analog signal with the output voltage of said output means, and a digital computer provided with timer means for counting the time after the instruction signal from said signal generating means and adapted for receiving the output of said comparator circuit.

Because of the above-explained structure, the A/D converter of the present invention enables the entry of an A/D converter value of an analog signal into a digital computer with an extremely simple external circuit, through only two signal lines even in case of entering, for example, an 8-bit digital signal. Consequently such A/D converter is extremely useful in combintion with a digital computer with a limited number of input/output ports such as a microcomputer.

Although the A/D conversion start signal is supplied from the digital computer in the foregoing embodiment, it is also possible to provide such start signal externally, for example, by key operations to the digital computer and the integrating circuit.

It will also be understood that the present invention is by no means limited to the foregoing embodiment but also includes any variation or modification within the scope and spirit of the appended claims.

What we claim is:

1. An analog-to-digital converter comprising:
   output means comprising an integrator circuit including a capacitor for generating an output signal in response to application of a start signal for instructing a start of analog-to-digital conversion of an input analog signal, the output signal being variable such that it increases in value and being generated as a reference signal for comparing with the input analog signal;
   comparing means for comparing the analog signal to be converted to a digital signal, with the value of the output signal generated by said output means, and for providing an output as a result of the comparison, when the output signal is equal to or greater than the analog signal;
   a bus line for transferring data therethrough;
   clock pulse generating means connected to said bus line for generating clock pulses;
   an output unit connected to said bus line for applying the start signal to said output means;
   an input unit connected to said bus line for receiving the output of said comparing means;
   counting means connected to said bus line for counting the number of clock pulses generated by said clock pulse generating means, said counting means generating a counting result transferred through said bus line;
   digital signal generating means connected to said bus line for generating a digital signal which is transferred through said bus line;
   memory means connected to said bus line for storing the digital signal transferred through said bus line; and
   program storing means connected to said bus line, for storing a program for analog-to-digital conversion, said program storing means comprising means for instructing said output unit to issue the start signal therethrough, means for instructing said counting means to count the number of clock pulses from the time when the start signal is applied from the output unit until the time when said input unit receives said output from said comparing means, means for instructing said digital signal generating means to generate a digital signal having a digital value directly corresponding to an analog value of the input analog signal on the basis of the counting result of said counting means transferred through said bus line, and means for storing the digital signal generated by said digital signal generating means in said memory means.

2. An analog-to-digital converter according to claim 1, further comprising means for supplying a reset signal to the integrator circuit for resetting thereof.

3. An analog-to-digital converter according to claim 1, said input unit comprising interrupting means for interrupting initial settings of said clock pulse generating means and a signal stored in said memory means to initiate the start signal, said program storing means further comprising means for initiating said interrupting means, and said counting means initiating counting in response to said program storing means initiating said interrupting means.

* * * * *

UNITED STATES PATENT AND TRADEMARK OFFICE
CERTIFICATE OF CORRECTION

PATENT NO. : 4,901,079

DATED : February 13, 1990

INVENTOR(S) : Nao Nagashima, et al.

It is certified that error appears in the above-identified patent and that said Letters Patent is hereby corrected as shown below:

ON THE COVER PAGE

IN THE U.S. PATENT DOCUMENTS

The following should be added:

3,564,406 2/1971 Henderson ............... 340/347 AD
3,731,302 5/1973 Neer .................... 340/347 AD.

COLUMN 3

Line 43, "combintion" should read --combination--.

Signed and Sealed this

Third Day of November, 1992

Attest:

DOUGLAS B. COMER

Attesting Officer      Acting Commissioner of Patents and Trademarks